United States Patent
Engbring et al.

(10) Patent No.: US 6,564,450 B2
(45) Date of Patent: May 20, 2003

(54) CONTACTING-MAKING SYSTEM FOR TWO PRINTED CIRCUIT BOARDS

(75) Inventors: Jürgen Engbring, Iphofen (DE); Ulrich Grzesik, Nürnberg (DE); Guido Renner, Kitzingen (DE); Jean-Francois Soule-Noulibos, Mulhouse (FR); Jacques Gerome, Kingersheim (FR); Jean-Michel Huot, Illzach (FR)

(73) Assignee: Leoni Bordnetz-Systeme GmbH & Co KG, Nuremberg (DE)

( * ) Notice: Subject to any disclaimer, the term of this patent is extended or adjusted under 35 U.S.C. 154(b) by 230 days.

(21) Appl. No.: 09/728,336

(22) Filed: Dec. 1, 2000

(65) Prior Publication Data

US 2001/0037561 A1 Nov. 8, 2001

(30) Foreign Application Priority Data

Dec. 1, 1999 (DE) .......................................... 199 57 789

(51) Int. Cl.$^7$ ................................................. H05K 3/36
(52) U.S. Cl. ......................... 29/830; 174/255; 174/261; 439/74
(58) Field of Search .......................... 29/830, 852, 846, 29/831, 848; 174/255, 261, 260; 439/65, 74, 66, 68, 69

(56) References Cited

U.S. PATENT DOCUMENTS

| | | | |
|---|---|---|---|
| 5,071,363 A | 12/1991 | Reylek et al. | |
| 5,299,939 A | * 4/1994 | Walker et al. | ................ 439/74 |
| 5,329,423 A | 7/1994 | Scholz | |
| 5,338,208 A | * 8/1994 | Bross et al. | ................... 439/66 |
| 5,342,207 A | 8/1994 | Sobhani | |
| 5,938,455 A | 8/1999 | Glovatsky et al. | |

FOREIGN PATENT DOCUMENTS

| | | |
|---|---|---|
| DE | 199 05 064 A1 | 8/1999 |
| DE | 298 23 576 U1 | 10/1999 |
| EP | 0 424 106 A2 | 4/1991 |
| EP | 0 602 610 A1 | 6/1994 |
| EP | 0 717 462 A2 | 6/1996 |
| EP | 0 849 120 A1 | 6/1998 |

* cited by examiner

*Primary Examiner*—David J. Walczak
(74) *Attorney, Agent, or Firm*—Laurence A. Greenberg; Werner H. Stemer; Gregory L. Mayback

(57) ABSTRACT

In a printed circuit board pair, each of the printed circuit boards having a contact region with contact elements, a contact-making system includes a first circuit board having three-dimensionally structured contact elements and a second circuit board also having three-dimensionally structured contact elements structured complementarily with respect to the contact elements of the first circuit board for positioning the two boards together. The contact elements of the first board reciprocally electrically contact the contact elements of the second board. The configuration ensures a high positioning accuracy of the two contact regions with respect to one another. A mask having cutouts for contact elements of the two boards can be provided. Such contact element positioning using the conductor track pattern and being independent of a contact-making housing has the advantage that the positioning accuracy is unaffected by tolerances between the conductor track pattern and the contact-making housing.

26 Claims, 3 Drawing Sheets

CONTACTING-MAKING SYSTEM FOR TWO PRINTED CIRCUIT BOARDS

BACKGROUND OF THE INVENTION

Field of the Invention

The invention relates to a contact-making system for two printed circuit boards which, for reciprocal contact-making, each have a contact region with contact elements.

A printed circuit board has a number of conductor tracks via which a functional element or an assembly is supplied and/or driven. In order to wire up and interconnect the individual functional elements or assemblies, for example in an on board electrical system of a motor vehicle, connecting elements or contact-making systems are provided via which printed circuit boards are connected to one another or a printed circuit board is connected to a conventional connector. The printed circuit boards have a rigid supporting layer, for example, on which the conductor tracks are applied or they are designed as flexible printed circuit boards for example in the form of conductor sheets with applied, in particular etched, conductor tracks.

Reliable and permanent contact-making is always necessary in order to maintain the functional reliability. This is particularly applicable in the automotive sector, where severe temperature fluctuations and vibrations occur. What is crucial for reliable contact-making is that the individual contact regions and contact elements of the elements that are to be connected to one another are positioned with great accuracy with respect to one another in the joining-together process. A high positioning accuracy has the advantage that the contact areas overlap one another to a great extent, a low contact resistance thereby being attained. On the other hand, the positioning accuracy has the effect that the spacing from neighboring contact elements is kept large enough to keep the risk of short circuits low.

The task of positioning a printed circuit board relative to a further printed circuit board or else to the contact areas of a connector is generally undertaken by a contact-making or connector housing. European Patent Application EP A 0 849 120, European Patent Application EP A 0 717 462, corresponding to U.S. Pat. No. 5,632,646 to Ii et al., German Published, Non-Prosecuted Patent Application DE A 199 05 064, corresponding to U.S. Pat. No. 6,017,244 to Daane, and German Utility Model DE U 298 23 576 disclose special contact-making housings for positioning printed circuit boards.

EP A 0 849 120 provides for the printed circuit board to be pushed into a slotted housing in such a way that a cutout of the printed circuit board in a contact region is aligned with a channel guided through the housing. Contact is made with the conductor track via a contact pin which is guided through the channel and the printed circuit board. The contact pin has a larger diameter than the cutout, thereby ensuring that contact is made. Therefore, the positioning is effected by way of the interaction of the contact pin guided in the channel with the cutout.

EP A 0 717 462 provides for the printed circuit board to be pushed into a conically tapering receptacle region of a contact-making housing, so that the printed circuit board is slightly curved and cannot be shifted within the contact-making housing. The printed circuit board is thus guided by the contact-making housing in this case.

DE A 199 05 064 and DE U 298 23 576 are concerned with the mutual contact-making of two printed circuit boards. Here, too, the task of positioning is undertaken by a contact-making housing. In accordance with DE A 199 05 064, the printed circuit boards are clamped in between two clamping jaws, centering pins being integrally formed on one of the clamping jaws, which pins are guided through cutouts in the printed circuit boards and engage in corresponding centering holes on the opposite clamping jaw. The clamping jaws have a structured surface which is impressed on the printed circuit boards in the form of an undulatory profile. DE U 298 23 576 discloses inserting one printed circuit board into a cutout in an upper housing half and positioning the second printed circuit board with respect to a lower housing half via centering pins of the latter, the centering pins of the lower housing half engaging in centering holes in the upper housing half. In order to ensure a sufficient contact pressure for a good contact, the lower housing half has spring means which act on the contact elements of the printed circuit boards. Contact bulges are provided for this purpose, the spring means engaging in said contact bulges, so that the contact bulges are pressed against the individual contact elements of the second printed circuit board.

What all the known embodiments have in common is the fact that the positioning is effected via the contact housing. Therefore, the positioning accuracy depends inter alia on the dimensional accuracy of the housing and, in particular, on the tolerances of the conductor tracks relative to the mechanical positioning elements. Reducing the tolerances for the purpose of increasing the positioning accuracy can only be achieved by complicated means, such as, for example, mechanical design changes to the contact-making housing.

An alternative option for positioning is optical position control, in which an automatic component-mounting machine determines the position optically. However, both technically and economically this method is practical only for undetachable permanent standard connections.

The invention is based on the object of specifying a contact-making system for two printed circuit boards with which a high positioning accuracy can be achieved.

SUMMARY OF THE INVENTION

The object is achieved according to the invention by means of a contact-making system for two printed circuit boards which, for reciprocal contact-making, each have a contact region with contact elements, in which case, for the positioning of the printed circuit boards, the two contact regions are three-dimensionally structured complementarily with respect to one another.

The essential underlying idea is to be seen in the fact that the function of positioning is taken care of by the contact regions themselves, so that positioning relative to housing parts is obviated. This necessarily obviates the problems which stem from tolerances between the conductor track pattern and the positioning elements. Thus, instead of positioning relative to a housing, the conductor track pattern itself is used as positioning element. The special three-dimensional structuring is provided for this purpose, through which, on account of the complementary configuration in particular of contact elements that are to be contact-connected to one another, automatic positioning is effected in the joining-together process. The two contact regions thus have elevations and depressions which define their position with respect to one another. The complementary three-dimensional structure permits a simple, reliable and fast joining-together process with high positioning accuracy of the two printed circuit boards.

In a preferred embodiment, the contact elements on the printed circuit boards form an elevation, so that the printed circuit boards are spaced apart from one another in the joined-together state. In this case, the height is chosen in such a way that, under a specific contact pressure, all the contact areas of the contact elements touch one another and further elements on the printed circuit board such as e.g. solder resist or uncovered conductor tracks do not touch one another, high functional reliability thereby being achieved.

In this case, the contact elements are preferably embodied as planar structural parts made of conductive material and are either applied in the form of laminae to the conductor tracks, for example by a soldering operation, or else formed by an embossing operation. If only low currents are to be transmitted, then carbon-filled plastic is also suitable, in particular, as a material for the contact elements. By way of example, the contact elements are embodied solidly in the form of a cube, a parallelepiped or a disk. Their contact area is preferably roughened in order to reduce the contact resistance. As an alternative to a contact area of planar design, complementary contact elements have a bulge and a complementary indentation in the region of their contact areas. This shaping results in self-centering of the contact element pair.

The contact elements, for forming the three-dimensional structure, preferably have different heights, the total height of the contact element pairs formed by complementary contact elements being identical. The different heights serve for positioning and the constant total height ensures that reliable contact is made with all the contact elements.

For the highest possible positioning accuracy, it is advantageous to provide at least two complementary contact element pairs which have a large spacing from one another; in particular, they are arranged on opposite end regions of the printed circuit boards.

In order to achieve reliable and permanent contact-making, a preferred embodiment provides for at least one contact element of a contact element pair to be of elastic design. In particular, the contact element is configured resiliently or as a spring. For this purpose, the contact element is, for example, constructed in two parts, the first part undertaking the actual contact-making and the other part ensuring the elasticity. Within a certain tolerance range, height differences between the two printed circuit boards can be bridged without difficulty by virtue of the elastic or resilient design.

For the same purpose, simultaneously or alternatively at least one of the printed circuit boards is of elastic design, so that the height tolerance compensation is automatically performed additionally or alternatively by one or by both printed circuit boards in the joining-together process. The printed circuit board of elastic design is thus pliant or flexible.

In accordance with a further preferred embodiment, in addition to the function purely of contact-making, a further function is also integrated in the contact region. For this purpose, at least one of the contact elements comprises an electronic component, which may be either an active or a passive component. By way of example, this component realizes the function of current limiting, of a series resistor, of rectification or of overtemperature protection. If a piezo-active element is used as the component, then a pressure-sensitive contact element, for example, is realized.

In a particularly advantageous refinement, a mask for arrangement between the printed circuit boards is provided, which has passage openings for the contact elements. Such a mask is composed of non-conducting material such as plastic or ceramic. As a result, on the one hand reliable insulation of neighboring contact elements is realized and, on the other hand, the relative movement of the printed circuit boards with respect to one another is limited within the production tolerances. Since the printed circuit boards are preferably pressed together by means of a contact-making housing, all degrees of freedom of movement of the printed circuit boards with respect to one another are limited and, consequently, reliable and permanent contact-making is achieved.

In preferred alternative embodiments, the mask is embodied either as an autonomous element in the form of a stencil for insertion between the two printed circuit boards or as a constituent part of at least one of the two printed circuit boards. In the first case, the stencil is particularly simple and light to produce and, in particular, it is part of a contact-making housing which is preferably a plastic injection-molded part. In conjunction with the stencil, the contact-making housing at the same time performs a protection function for the contact region, provides for strain relief and brings about a sufficiently high contact pressure.

If the mask is embodied as a constituent part of one of the printed circuit boards, then the number of structural parts is reduced. For this purpose, a resist, for example, is applied to the printed circuit board and is removed in the region of the contact-making elements using suitable methods.

Preferably, with the printed circuit boards joined together, the thickness of the mask maximally reaches the total height of the contact element pairs, thereby ensuring that contact is made with the individual contact elements. For this purpose, the mask has, for example, a thickness which is slightly less than the total height, thereby ensuring reliable guidance of the contact elements through the mask.

The masks is preferably made of an elastic material and has, in particular, a thickness which exceeds the total height of the contact element pairs. When the printed circuit boards are joined together, the elastic mask is then compressed and preferably performs a sealing function, so that the contact region is sealed toward the outside.

In order to produce reliable contact-making, a contact pressure is preferably exerted on the printed circuit boards by a contact-making housing in the joined-together state. In particular, the contact-making housing has an elastic region in the contact-making region, so that height tolerance compensation can be effected in the event of production-dictated height differences between the individual contact elements. The contact-making housing thus acts with a spring force on the contact-making region.

The concept of the intrinsic positioning of the contact regions with respect to one another by means of complementarily designed, three-dimensional structures is preferably also provided for printed circuit boards with which contact can be made on both sides and which are arranged in a layered manner one above the other. In particular, three to five printed circuit boards of this type are arranged in a layered manner.

Exemplary embodiments of the invention are explained in more detail below with reference to the drawings.

DESCRIPTION OF THE PREFERRED EMBODIMENT

Figure 1:
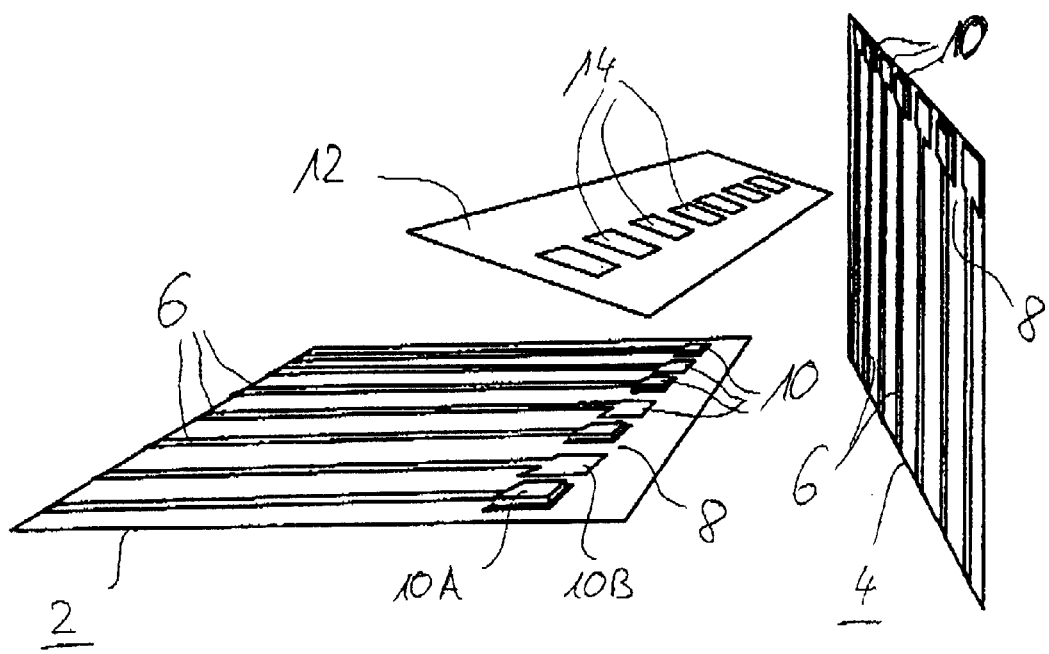
FIG. 1 shows a perspective view of two printed circuit boards with stencil.

In all the figures of the drawing, sub-features and integral parts that correspond to one another bear the same reference symbol in each case.

Referring now to the figures of the drawings in detail and first, particularly to FIG. 1 thereof, there is shown a first and a second printed circuit board 2, 4 each having a number of conductor tracks 6 which lead into a contact region 8. In this case, a contact element 10 is assigned to each individual conductor track 6 in the contact region 8. Furthermore, a mask 12 designed as a stencil and serving for arrangement between the printed circuit boards 2, 4 is provided, which mask has cutouts 14 for the contact elements 10.

The printed circuit boards 2, 4 are designed as stiff printed circuit boards or else as flexible printed circuit boards, for example in the form of conductor sheets. The contact elements 10 have a different height, so that the contact region 8 of each printed circuit board 2, 4 has a three-dimensional structure. In this case, the contact regions 8 are structured in such a way that they have a mutually complementary three-dimensional structure. In the exemplary embodiment as shown in FIG. 1, this is achieved by the provision of two contact element types, namely a high contact element 10A and a low contact element 10B, which are arranged alternately next to one another. In this case, a respective high contact element of the first printed circuit board 2 is provided for making contact with a low contact element 10B of the second printed circuit board 4. The individual contact elements 10 thus engage in one another virtually like teeth or in crenellated fashion. As a result, the two printed circuit boards 2, 4 are positioned with respect to one another and lateral shifting is not made possible. The mask 12 additionally precludes shifting in the longitudinal direction and, moreover, the individual contact elements 10 are insulated from one another by the mask 12.

The contact elements 10, in particular the high contact elements 10A, are embodied as laminae, for example, which are applied to the respective printed circuit board 2, 4 by soldering. Correspondingly thinner laminae are provided for the low contact elements 10B, or they are formed by widening the conductor tracks 6 leading to them.

For a high positioning accuracy and in order to keep the production tolerances as small as possible, it is extremely expedient if the individual contact elements 10 are applied to the positions provided for them on the printed circuit boards 2, 4 with high accuracy. A high accuracy is achieved by automatic component-mounting machines, for example, which determine the position using optical methods and subsequently solder the contact elements 10 to the printed circuit board 2, 4. Given an appropriate embodiment of the soldering method, the effect of self-centering governed by the surface tension of the liquid solder can be utilized for accurately aligning the individual contact elements 10. A high accuracy can also be attained by means of an electrochemical plating method. This method is particularly suitable for relatively small connection grids, since the accuracy of the plating operation is particularly high. In order to achieve the thinnest possible dimensions, a stamped out sheet is preferably used as mask 12 in this case. A particularly thin and flexible contact point can be generated in this way.

Figure 2:
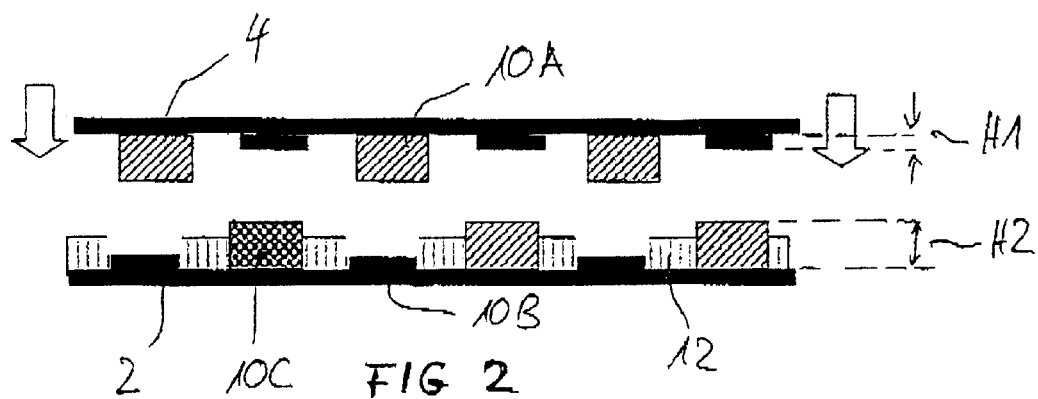
FIG. 2 shows two printed circuit boards in a sectional view with stencil directly before the joining-together process.
Figure 3:
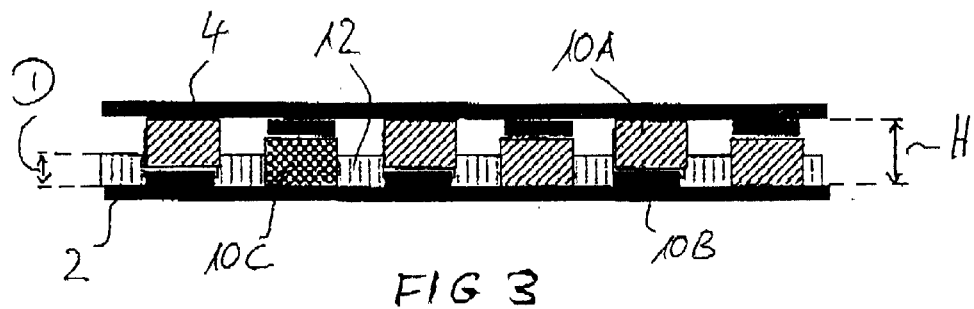
FIG. 3 shows the two printed circuit boards as shown in FIG. 2 in the joined-together state.
Figure 4:
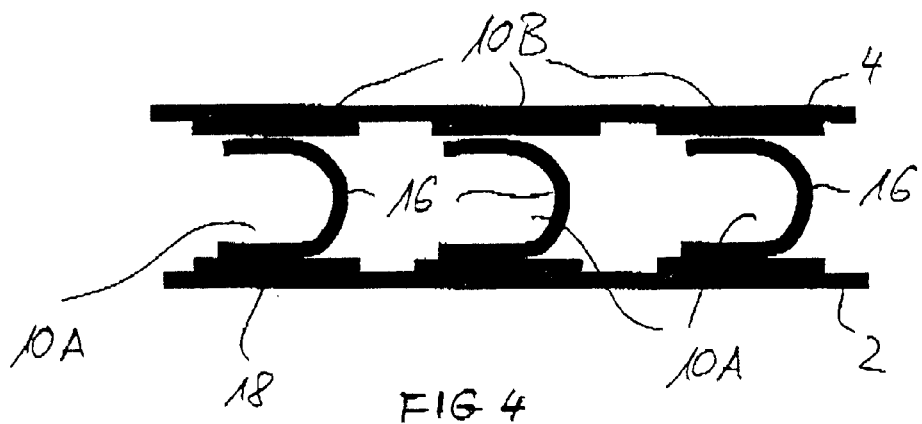
FIG. 4 shows two printed circuit boards in a lateral sectional view with resiliently configured contact elements.

The contact-making operation is effected as shown in FIGS. 2 and 3, according to which the two printed circuit boards 2, 4 are aligned parallel to one another in the contact region 8, so that a high contact element 10A is in each case aligned above a low contact element 10B. In accordance with this exemplary embodiment, the mask 12 is fixedly applied to the first printed circuit board 2 and forms a unit with the latter. In this case, the thickness D of the mask 12 is dimensioned in such a way that it is greater than the low height Hl of the low contact elements 10B and, at the same time, less than the large height H2 of the high contact elements 10A. It is important for the thickness D to be greater than the height H1, so that the mask 12 prevents the two conductor tracks from slipping laterally with respect to one another, in order to attain a high positioning accuracy. On the other hand, the thickness D in the mounted end state should not exceed the total height H of a contact element pair 10A, 10B, resulting from the sum of the two heights Hl and H2. This ensures that the two contact elements 10B, 10A actually come into contact by way of their contact areas. The mask 12 is preferably of elastic design, that is to say compressible, so that—as an alternative to the embodiment as shown in FIGS. 3 and 4—it can have a thickness D greater than the total height H before the printed circuit boards 2, 4 are joined together. When the printed circuit boards 2, 4 are joined together, a contact pressure is exerted, so that the mask 12 is compressed, and the respective contact element pairs 10A, 10B come into contact with one another. At the same time, the mask 12 bears both on the first printed circuit board 2 and on the second printed circuit board 4 and thus ensures that the contact region 8 is reliably sealed from its environment.

In accordance with FIGS. 2 and 3, one of the high contact elements 10A is designed as a special contact element 10C which comprises or forms an electronic component. This electronic component may be embodied as an active or passive component and serves, for example, for current limiting or else as a temperature or pressure sensor.

Since production-dictated differences occur in connection with the heights H1 and H2 of the individual contact elements 10A, 10B, height compensation is extremely expedient for reliable contact-making. This can be done in various ways which can be used alternatively or in combination. First, by way of example, the contact elements 10 themselves are of elastic design, that is to say, in particular, compressible, so that height differences are compensated upon the joining-together of the two printed circuit boards 2, 4 under a certain contact pressure. As a further possibility, one or both printed circuit boards 2, 4 is or are of elastic, that is to say pliant, design, so that they are adapted to the required total height H in a position-dependent manner. In addition to the elastic design of the contact elements 10 through a suitable elastic material, the contact elements 10 are of resilient design, as is indicated in FIG. 4.

In accordance with FIG. 4, a contact element 10A of a contact element pair 10A, 10B is in each case configured resiliently and, for this purpose, has a bent leaf spring 16, for example. This leaf spring 16 is connected to the first printed circuit board 2 via a base 18. The elastic or resilient configuration of the contact elements 10 is alternatively achieved by means of a two-part embodiment with a fixed metal contact lamina and an elastic support.

Figure 5:
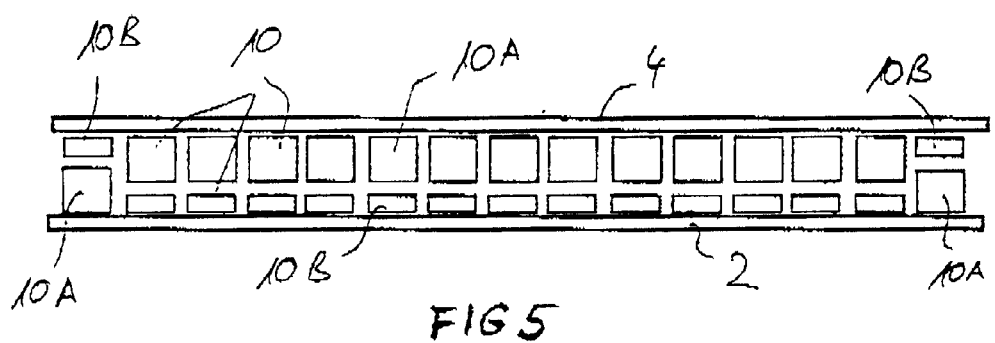
FIGS. 5–7 show alternative embodiments of a complementary three-dimensional structure of the printed circuit boards in the contact region.
Figure 6:
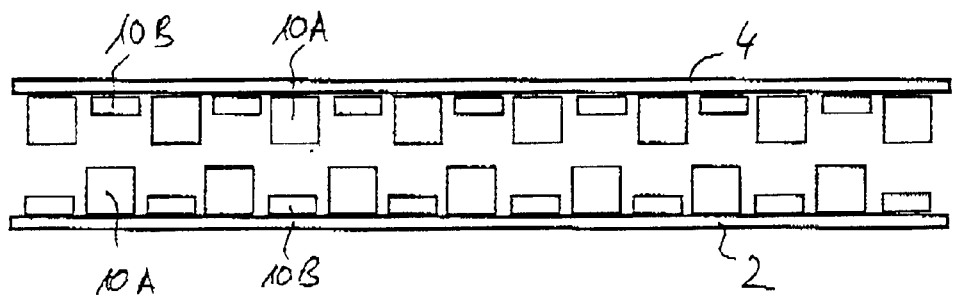
Figure 7:
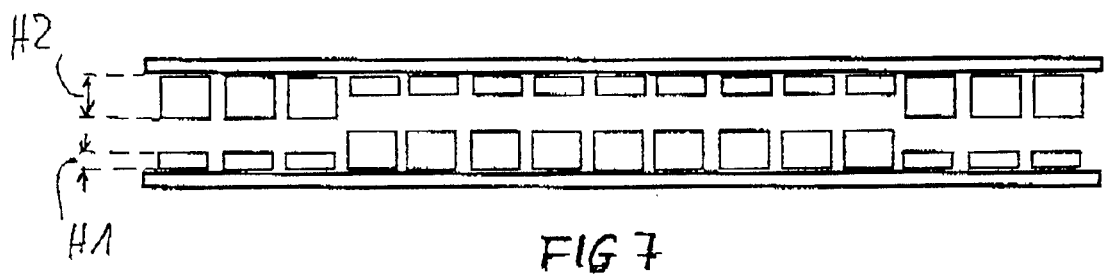

FIGS. 5 to 7 diagrammatically illustrate various possibilities for the design of the three-dimensional structure. In accordance with FIG. 5, only the two outer contact elements 10 of the first printed circuit board 2 are embodied as high contact elements 10A and all the contact elements 10 in between are embodied as low contact elements 10B. In a complementary manner to this, the contact elements 10 of the second printed circuit board 4 are embodied as high contact elements 10A in the central region.

In accordance with FIG. 6, the high contact elements 10A are arranged in an alternating manner with the low contact elements 10B on each printed circuit board 2, 4. And in accordance with FIG. 7, the contact region is again divided into two edge regions and a central region, but in this case, in contrast to FIG. 5, three contact elements 10A, 10B of the same height H1, H2 are in each case arranged in the edge region.

Figure 8:
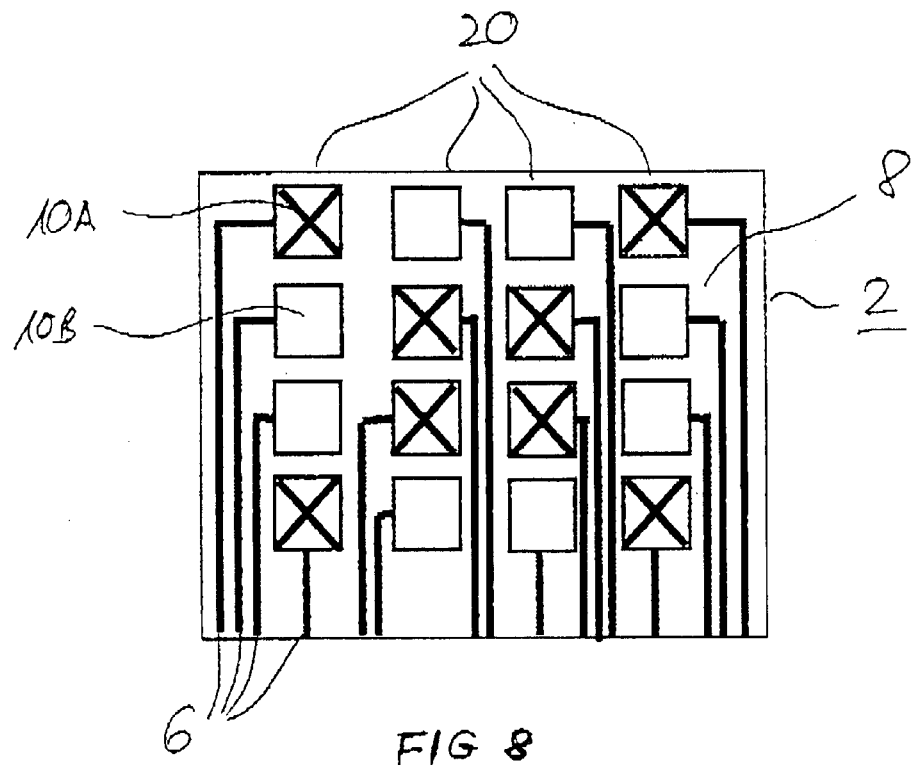
FIG. 8 shows a plan view of a printed circuit board with an arrangement of contact elements.

FIG. 8 shows a particularly advantageous arrangement of the contact elements 10 in the contact region 8 of the printed circuit board. The high contact elements 10A are identified by a cross, while the low contact elements 10B are represented as a white box. The arrangement of the contact elements 10 is distinguished by its dense and compact arrangement. The reliable positioning governed by the three-dimensional complementary structuring of the contact region 8 enables the dense arrangement of the contact elements 10, without negative effects such as, for example, an excessively small overlap of contact areas or undesirable contact-making with neighboring contact elements being avoided. The conductor tracks 6 are guided past the contact elements 10, which are arranged in contact rows 20, in the interspaces.

Figure 9:
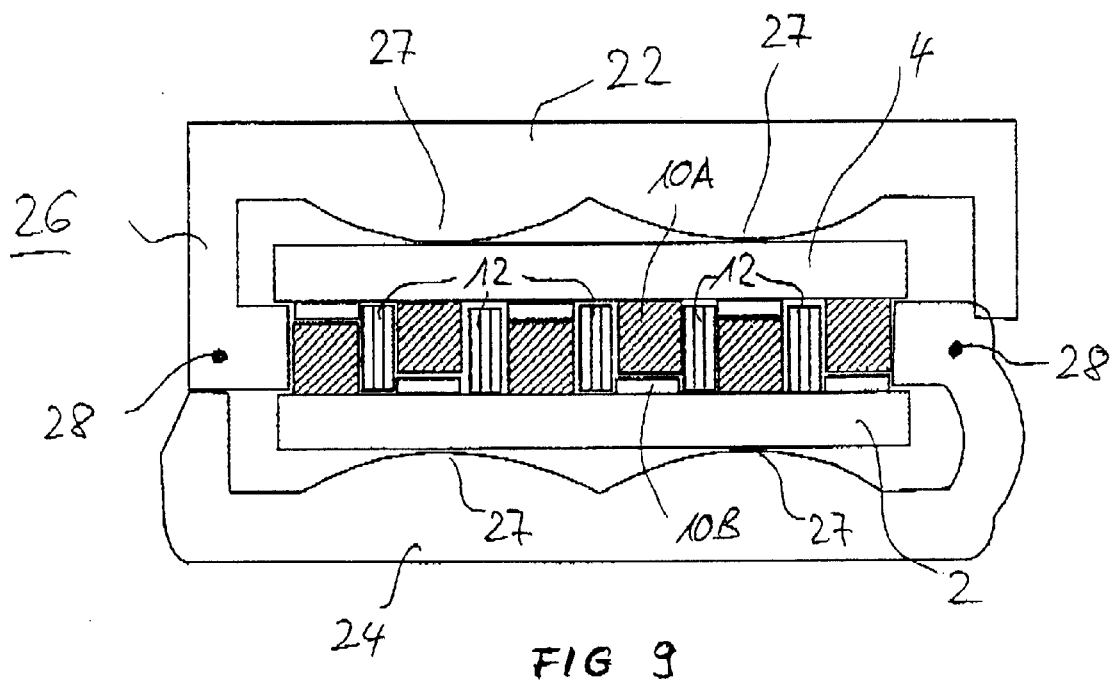
FIG. 9 shows a contact-making housing with clamped in printed circuit boards.

In accordance with FIG. 9, the two printed circuit boards 2, 4 are pressed in between an upper housing part 22 and a lower housing part 24 of a contact-making housing 26, so that reliable contact-making is obtained through the contact pressure. In order to enable height compensation across the contact region 8, the two housing parts 22, 24 are not of rigid design but rather have flexurally elastic regions 27 and exert a spring force on the two printed circuit boards 2, 4.

The mask 12 is an integral constituent part of the contact-making housing 26 and connects the two housing parts 22, 24 to one another and, just like the housing parts 22, 24, is designed as a plastic injection-molded part. For this purpose, the mask 12 is connected to the two housing parts 22, 24 via a hinge 28 in each case, so that the housing parts 22, 24 can in each case be folded aside in order to insert the printed circuit boards 2, 4.

The preferred configuration in accordance with FIG. 9 limits all degrees of freedom of movement for the two printed circuit boards 2, 4. To be precise, the two degrees of freedom in the plane of the printed circuit boards 2, 4 are limited by the three-dimensional structuring of the contact elements 10 and also by the arrangement of the mask 12. The degree of freedom which is arranged perpendicularly to this area is limited by the contact-making housing 26. Consequently, in the joining-together process, owing to the three-dimensional complementary structuring, precise centering is achieved on account of the special shaping of the conductor track pattern in the contact region 8, which is also maintained permanently by the special arrangement in the contact-making housing 26.

Instead of the multipart design of the contact housing 26, in an alternative configuration the contact-making housing 26 is produced by encapsulation by injection-molding or foaming of the contact region 8.

The above-described embodiments of the three-dimensionally structured contact region 8 represent particularly preferred configurations. However, the three-dimensional structuring is not restricted to these configurations. Rather, the underlying idea of positioning the printed circuit boards 2, 4 using the conductor track pattern and independently of the contact-making housing 26 can also be realized in alternative ways.

By way of example, the first printed circuit board 2 has, in the contact region 8, a cutout or a hole into which or through which a complementary pin of the second printed circuit board 4 engages or reaches. In this case, the hole and the pin are arranged either centrally in the respective contact element 10 or else directly beside it. It suffices if, in this case, one of the contact elements 10 is elevated only slightly from the printed circuit board 2, 4 and the other is designed to be flat.

In a further alternative, one contact element 10 of a contact element pair has a, for example, conical recess in which a complementarily designed mating piece of the further contact element 10 engages. The mating piece is embodied in a cone-like manner, for example, so that self-centering is effected between the two contact elements 10.

We claim:

1. In a printed circuit board pair, each of the printed circuit boards having a contact region with contact elements, a contact-making system comprising:
    a first board of the printed circuit board pair having three-dimensionally structured contact elements;
    a second board of the printed circuit board pair having three-dimensionally structured contact elements structured complementarily with respect to said contact elements of said first board for positioning said first board and said second board together;
    a mask having passage openings for receiving said contact elements, said mask being disposed between the printed circuit board pair; and
    said contact elements of said first board electrically contacting said contact elements of said second board.

2. The system according to claim 1, wherein each of said contact elements of said first board electrically contacts a respective one of said contact elements of said second board.

3. The system according to claim 1, wherein said contact elements of said first board and said second board form at least one elevation to space apart said first board and said second board from one another in a joined-together state of the printed circuit board pair.

4. The system according to claim 3, wherein:
    said contact elements of said first board and said second board have different heights; and
    complementary contact elements of said contact elements of said first board and said contact elements of said second board define contact element pairs each having a combined height substantially similar to a combined height of another contact element pair.

5. The system according to claim 4, wherein said combined height is identical to a combined height of another contact element pair.

6. The system according to claim 1, wherein complementary contact elements of said contact elements of said first board and said contact elements of said second board define at least two complementary contact element pairs spaced apart from one another.

7. The system according to claim 6, wherein:

said first board and said second board have a given length; and said at least two complementary contact element pairs are spaced apart from one another approximately equal to said given length.

8. The system according to claim 6, wherein:

said first board and said second board each have end regions; and said at least two complementary contact element pairs are disposed at said end regions.

9. The system according to claim 6, wherein:

said first board and said second board each have end regions spaced apart from one another; and said at least two complementary contact element pairs are disposed at said end regions.

10. The system according to claim 1, wherein:

complementary contact elements of said contact elements of said first board and said contact elements of said second board define contact element pairs; and at least one contact element of at least one of said contact element pairs is elastic.

11. The system according to claim 10, wherein said at least one contact element of at least one of said contact element pairs is resilient.

12. The system according to claim 1, wherein at least one circuit board of the printed circuit board pair is elastic.

13. The system according to claim 1, wherein at least one of said contact elements is an electronic component.

14. The system according to claim 1, wherein said mask is an autonomous element.

15. The system according to claim 1, wherein:

the printed circuit board pair is to be inserted into a contact-making housing; and said mask is part of a contact-making housing.

16. The system according to claim 1, including a contact-making housing for holding the printed circuit board pair, said mask being part of said contact-making housing.

17. The system according to claim 1, wherein said mask is a part of at least one circuit board of the printed circuit board pair.

18. The system according to claim 1, wherein:

complementary contact elements of said contact elements of said first board and said contact elements of said second board define contact element pairs each having a combined height; and said mask has a thickness less than or equal to said combined height when the printed circuit board pair is joined together.

19. The system according to claim 1, wherein said mask is elastic.

20. The system according to claim 1, wherein:

the printed circuit board pair is to be inserted into a contact-making housing; and said contact-making housing exerts contact pressure on the printed circuit board pair when the printed circuit board pair is joined together.

21. The system according to claim 20, wherein the contact-making housing has an elastic region for exerting contact pressure on the printed circuit board pair.

22. The system according to claim 1, including a contact-making housing for holding the printed circuit board pair, said contact-making housing exerting contact pressure on the printed circuit board pair when the printed circuit board pair is joined together.

23. The system according to claim 22, wherein said contact-making housing has an elastic region for exerting contact pressure on the printed circuit board pair.

24. A printed circuit board assembly, comprising:

a first printed circuit board having a first contact region with first contact elements;

a second printed circuit board having a second contact region with second contact elements;

said first contact elements and said second contact elements being three-dimensionally structured complementarily with respect to one another for positioning said first and second printed circuit boards together;

a mask having passage openings for receiving said first and second contact elements, said mask being disposed between said first and second printed circuit boards; and each of said first contact elements contacting a respective one of said second contact elements.

25. A method for assembly of two printed circuit boards, which comprises:

three-dimensionally structuring first contact elements on a first contact region of a first printed circuit board;

three-dimensionally structuring second contact elements on a second contact region of a second printed circuit board to complement the three-dimensionally structured first contact elements;

placing a mask between the first and second printed circuit boards, the mask having passage openings for receiving the first and second contact elements; and contacting said first contact elements with said second contact elements by positioning said first and second printed circuit boards together.

26. The method according to claim 25, which further comprises performing the contacting step by contacting each of said first contact elements with a respective one of said second contact elements by positioning said first and second printed circuit boards together.

* * * * *